(12) United States Patent
Das

(10) Patent No.: US 12,167,199 B2
(45) Date of Patent: Dec. 10, 2024

(54) MOBILE PHONE BASED HEARING LOSS CORRECTION SYSTEM

(71) Applicant: BENGAL REHABILITATION GROUP, West Bengal (IN)

(72) Inventor: Suporno Das, West Bengal (IN)

(73) Assignee: BENGAL REHABILITATION GROUP, West Bengal (IN)

( * ) Notice: Subject to any disclaimer, the term of this patent is extended or adjusted under 35 U.S.C. 154(b) by 161 days.

(21) Appl. No.: 17/621,915

(22) PCT Filed: Jun. 26, 2020

(86) PCT No.: PCT/IN2020/050553
§ 371 (c)(1),
(2) Date: Dec. 22, 2021

(87) PCT Pub. No.: WO2020/261296
PCT Pub. Date: Dec. 30, 2020

(65) Prior Publication Data
US 2022/0272464 A1    Aug. 25, 2022

(30) Foreign Application Priority Data
Jun. 27, 2019   (IN) .............................. 201931025520

(51) Int. Cl.
*H04R 25/00*    (2006.01)
*H03G 3/30*     (2006.01)
(Continued)

(52) U.S. Cl.
CPC ......... *H04R 25/505* (2013.01); *H03G 3/3005* (2013.01); *H03G 5/165* (2013.01);
(Continued)

(58) Field of Classification Search
CPC ..... H03G 3/3005; H03G 5/165; H04M 1/026; H04R 25/505; H04R 1/326; H04R 25/40; H04R 25/554; H04R 25/558; H04R 2225/43; H04R 2430/01; H04R 2499/11; H04R 1/1083; H04R 25/353; H04R 2430/03
See application file for complete search history.

(56) References Cited

U.S. PATENT DOCUMENTS 7,529,545 B2 *   5/2009   Rader ................... H04R 25/70
                                                  455/268
8,922,485 B1 *  12/2014   Lloyd ................. H04M 1/6505
                                                  345/158
(Continued)

*Primary Examiner* — Brian Ensey
(74) *Attorney, Agent, or Firm* — D'Ambrosio & Menon, PLLC; Usha Menon

(57) ABSTRACT

A hearing loss correction system which is mobile compatible and comprises of a mechanism, wherein the mobile device module when in the OFF condition is used as a hearing assistive and amplification device. The hearing loss correction system comprises a microphone unit, a speaker unit and a mobile phone inbuilt application processor to operatively connect the microphone unit with the speaker unit for recording environmental sound signal though the microphone unit and storage free direct streaming of said recorded sound signal to the speaker unit upon real time amplification and background noise suppression.

9 Claims, 5 Drawing Sheets

(51) Int. Cl.
  *H03G 5/16*  (2006.01)
  *H04M 1/02*  (2006.01)
  *H04R 1/32*  (2006.01)

(52) U.S. Cl.
  CPC ............ *H04M 1/026* (2013.01); *H04R 1/326* (2013.01); *H04R 25/40* (2013.01); *H04R 25/554* (2013.01); *H04R 25/558* (2013.01); *H04R 2225/43* (2013.01); *H04R 2430/01* (2013.01); *H04R 2499/11* (2013.01)

(56) References Cited

U.S. PATENT DOCUMENTS

| | | |
|---|---|---|
| 2005/0260978 A1 | 11/2005 | Rader et al. |
| 2011/0295919 A1 | 12/2011 | Massenburg |
| 2017/0230767 A1 | 8/2017 | Simonides et al. |

\* cited by examiner

MOBILE PHONE BASED HEARING LOSS CORRECTION SYSTEM

FIELD OF THE INVENTION

The present invention relates to hearing correction. More specifically the present invention is directed to develop mobile phone based hearing loss correction system for hearing impaired people.

BACKGROUND OF THE INVENTION

Hearing loss that occurs gradually with age (presbyopia) is common. According to a WHO study, one out of five people suffer from some degree of hearing loss. Hearing loss is defined as one of three types: Conductive (involves outer or middle ear); Sensorineural (involves inner ear) and Mixed (combination of the two). Ageing and chronic exposure to loud noises both contribute to hearing loss. Other factors, such as excessive earwax, can temporarily reduce how well your ears conduct sounds.

A hearing aid device is a device for aiding an individual in regard to its hearing. It may be a hearing prosthesis for compensating a hearing loss, namely a conventional acoustic hearing aid amplifying sound or a cochlear implant electrically stimulating nerve cells. It may also be a hearing protection device which helps individuals to hear without damage in noisy environments. It may also be a tinnitus treatment device. The individual may be an adult, but it may also be an infant or child.

Custom hearing aid devices comprise a shell or ear mold custom fit and moulded to| the ear canal of each individual user. Such hearing aid devices are therefore quite expensive as well as time consuming to make. The receiver in such hearing aids is normally mounted on a tube that goes to a sound outlet facing the internal ear of the user and placed next to the opening of a vent or venting passage traversing the weaShell primarily placed to allow for reduction of the occlusion effect.

A further problem with custom hearing aid devices is the space concern as the two openings of the receiver (the sound outlet) and of the vent, respectively, unavoidably takes up a lot of valuable space contrary to the general objective of making the tip of the hearing aid as small as possible.

In order to keep the brain alert and to reduce the progression rate of cortical atrophy at a senior age, hearing loss correction system is helpful. As per Internet sources, nowadays, roughly there are around 25 crores of hearing aid users and around 450-500 crores of mobile users.

The existing hearing aid devices are expensive, availability is less and the hearing aid modality is not within any mobile device. There is a stigma associated with the existing hearing aid devices. Therefore, it is readily apparent that there is a need for a hearing loss correction system operational via user interface that classifies hearing loss based on several| parameters and provides adequate hearing to the users.

Recently, some mobile based hearing aid devices have also been reported, e.g. EP2521377A1 discloses a method for providing a personal communication device with hearing support, said personal communication device comprising an input for receiving an input audio signal, programmable processing means and an output for outputting an audio signal derived from said processed input audio signal.

3094/CHE/2011 discloses a hearing aid system including a mobile communication device in conjunction with an inbuilt application platform capable of enhancing voice signals and a method adapted for facilitating a cross-link wireless communication between a pair of users are disclosed. The mobile communication device in conjunction with an application platform includes a processor for processing and amplifying the plurality of received voice signals from a first user. The plurality of amplified voice signals are modulated and transmitted to a wireless headset used by a second user through the mobile communication device over a data communication network.

5032/CHE/2013 discloses a smart phone with the features of hearing aid into the smart cellular phone.

However such reported mobile phone based hearing aids cannot reduce the environmental noise. Also these existing mobile phone based hearing aids operates slow with a time lag between picking up of the sound signal and delivery of said sound signal to its user as the sound signal has to traverse though storage elements and different application processors of the mobile phone. This time lag problem makes the existing mobile phone based hearing aids not suitable for real time sound picking and amplification for hearing impaired people.

Thus there has been a need for developing a faster and accurate mobile phone based hearing loss correction system which can operate as hearing aid for hearing impaired people and suitably serve the need of real time sound picking and amplification for hearing impaired people.

OBJECTIVE OF THE INVENTION

The principal objective of the present invention is to develop a mobile phone based hearing loss correction system which would operate as hearing aid for hearing impaired people and overcome the disadvantages of the conventional systems.

Another objective of the present invention is to provide a mobile phone based hearing loss correction system that is easy to operate, simple in design and economical.

Another objective of the present invention is to provide a mobile phone based hearing loss correction system that is not harmful to mobile users.

Yet another objective of the present invention is to provide a mobile phone based hearing loss correction system that classifies hearing loss on the basis of three parameters, mild hearing loss, moderate hearing loss and moderately severe hearing loss.

Yet another objective of the present invention is to provide a mobile phone based hearing loss correction system which would operate in real time including processing of the sound signal for increasing clarity and suppression of the noise.

The foregoing and other objects of the present invention will become readily apparent upon further review of the following detailed description of the preferred embodiment as illustrated herein.

SUMMARY OF THE INVENTION

Thus according to the basic aspect of the present invention there is provided a mobile phone based hearing loss correction system comprising
- a microphone unit;
- a speaker unit; and
- a mobile phone inbuilt application processor to operatively connect said microphone unit with said speaker unit for recording environmental sound signal though the microphone unit and storage free direct streaming of said recorded sound signal to the speaker unit upon real time amplification and background noise suppression.

In a preferred embodiment of the present mobile phone based hearing loss correction system, the microphone unit comprises the mobile phone inbuilt microphone or omnidirectional microphone to record environmental sound and generate the sound signal for the application processor.

In a preferred embodiment of the present mobile phone based hearing loss correction system, the speaker unit comprises headphones or speakers remotely connectable to the mobile phone in wired or wireless manner for receiving amplified and background noise suppressed streaming sound signal from the application processor and playing the same.

In a preferred embodiment of the present mobile phone based hearing loss correction system, the application processor is configured to directly stream the sound signal from the mobile phone inbuilt microphone to the headphones or speakers unit upon real time amplification and background noise suppression without involving any storage elements of the mobile phone and operates based on user's instruction from user interface of the mobile phone.

In a preferred embodiment of the present mobile phone based hearing loss correction system, the application processor includes sound signal streaming channel having multiple bands of frequencies in range of 30 Hz to 20000 Hz for dividing the sound signal into different streaming bands of frequencies for configurable filtering of said different streaming bands based on noises reside in therein and controlling the streaming sound signal.

In a preferred embodiment of the present mobile phone based hearing loss correction system, the sound signal streaming channel preferably includes 5 bands with identical architecture and independent parameters covering the frequency range of 30 Hz to 20000 Hz as

| Eq Band# | Centre (mHz) | Min(mHz) | Max(mHz) |
| --- | --- | --- | --- |
| 1 | 60000 | 30000 | 120000 |
| 2 | 230000 | 120001 | 460000 |
| 3 | 910000 | 460001 | 1800000 |
| 4 | 3600000 | 1800001 | 7000000 |
| 5 | 14000000 | 7000001 | 20000000 |

In a preferred embodiment of the present mobile phone based hearing loss correction system, the sound signal streaming channel includes
  an input gain unit for initial amplification of the sound signal;
  a first Multi-band Equalizer or Pre-Equalizer for initial adjustment of frequency components within the sound signal by strengthening or weakening energy of specific frequency components of the sound signal to achieve equalization;
  a Multi-band Compressor to split the equalized sound signal into different frequency bands and compress them independently for eliminating noised frequency bands and to control the sound signal including increasing clarity of the sound signal by sending specific frequency bands thereof to the speaker;
  a second Multi-band Equalizer or Post-Equalizer for final adjustment of frequency components within the sound signal from the Multi-band Compressor by strengthening or weakening energy of specific frequency components of the sound signal to achieve equalization;
  a Single band compressor/limiter to reduce static and repeating noises including hissing sounds of the microphone in the sound signal from the second Multi-band Equalizer.

In a preferred embodiment of the present mobile phone based hearing loss correction system, the application processor includes
  start switch to starts the process of getting sound signal from the microphone, applying filters to it and sending the speaker as a live audio stream;
  volume controller switch for controlling volume of the live audio stream;
  equalizer band controller switch for controlling gain of each bands;
  noise threshold controller switch for increasing noise threshold level for the sound signal; and
  stop switch to stop the live audio streaming.

In a preferred embodiment of the present mobile phone based hearing loss correction system, the application processor further comprises noise gate operatively connected to the sound signal streaming channel for further removing noise from the sound signal received from the sound signal streaming channel before sending to the speaker.

In a preferred embodiment of the present mobile phone based hearing loss correction system, the Multi-band Compressor independently compress the frequency bands by including
  setting attack time in milliseconds and speed at which the compressor acts on the input signal whereby slow attack time allows beginning component of the signal to pass through, uncompressed and whereby a fast attack time triggers compression immediately when the signal exceeds a compression threshold;
  setting release time in milliseconds and length of time the compressor takes to return gain reduction of the signal back to zero after crossing below the compression threshold whereby a short release times produce a choppy or "jittery" sound, especially when compressing instrument sounds having low-frequency components and whereby long release times result in an over-compressed, or "squashed," sound;
  setting compression slope ration, which is a function of signal output level versus signal input to selectively operate between mild compression and hard compression; and
  setting the compression threshold.

In a preferred embodiment of the present mobile phone based hearing loss correction system, the Multi-band Compressor independently compress the frequency ranges by further including
  setting Knee Width of the compressor either in soft knee or in hard knee, whereby with the hard-knee compression, the gain reduction applied to the signal occurs as soon as the signal exceeds the level set by the threshold and with the soft-knee compression, the onset of gain reduction occurs gradually after the signal has exceeded the threshold, producing a more musical response;
  setting noise gate threshold for fixing level at which the noise gate opens whereby essentially, all signals above the threshold setting are passed through unaffected and signals below the threshold setting are reduced in level by the amount set by range control;
  setting expansion ratio for fixing amount of reduction applied to a signal once the signal has dropped below the expansion threshold.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

Figure 1:
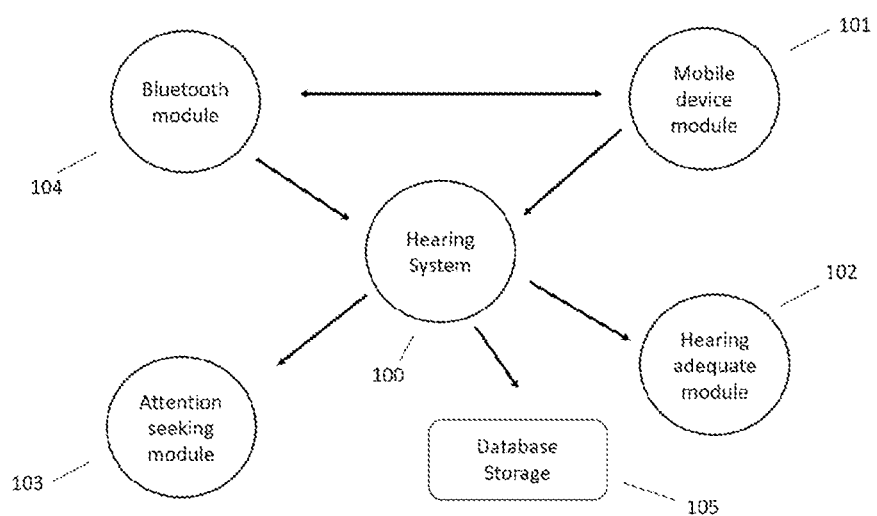
FIG. 1 illustrates a block diagram embodying the present mobile phone based hearing loss correction system.

The present invention is directed to a hearing loss correction system that classifies hearing loss based on several parameters and provides adequate hearing to the users by involving the mobile phone platform.

According to an embodiment of the present invention, the system comprises a mobile phone module operating as a hearing assistive and amplification device that continuously receives environmental sounds and speech and a mobile phone connected headphones or speakers such as Bluetooth technology enabled speaker for hearing the receiving sounds and speech. A hearing adequate default module i.e. a mobile phone inbuilt application processor is used for direct streaming of environmental sound signal to the headphones or speakers in different situations with real time sound processing and clarity improving including noise elimination.

The system 100 of the present invention is mobile compatible and comprises of a mechanism, wherein the mobile device module 101 when in the OFF condition is used as a hearing assistive and amplification device that continuously receive environmental sounds and speech and a Bluetooth technology enabled speaker unit 104 for hearing the receiving sounds and speech, a hearing adequate default module 102 used in different situation with basic setting option including noisy area, silent area and meeting area and monitors speech-in-noise-ratio (S/N ratio).

The hearing loss correction system restricts hearing loss and progression rate and classifies hearing loss on the basis of three parameters, mild hearing loss, moderate hearing loss and moderately severe hearing loss.

The system may comprises of an attention seeking feature module 103 which is activated when the other modalities and the hearing amplification mechanism is the ON condition.

People use mobile phones directly on the ear by using Bluetooth or headphones. Once the mobile is in the OFF condition it can be used for several purposes like watching movies, you tube etc. In the absence of the modalities the mobile phone acts as an amplification device. While the disclosure has been presented with respect to certain specific embodiments, it will be appreciated that many modifications and changes may be made by those skilled in the art without departing from the spirit and scope of the disclosure. It is intended, therefore, by the appended claims to cover all such modifications and changes as fall within the true spirit and scope of the disclosure.

As per the requirements of mobile phone based hearing loss correction system, the mobile phone inbuilt application processor of the hearing adequate default module 102 is configured to operatively connect microphone unit of the mobile phone with the speaker unit such as to enable recording of environmental sound signal though the microphone unit and directly streaming said recorded sound signal to the speaker unit upon real time amplification and background noise suppression on said streaming sound signal.

Figure 2:
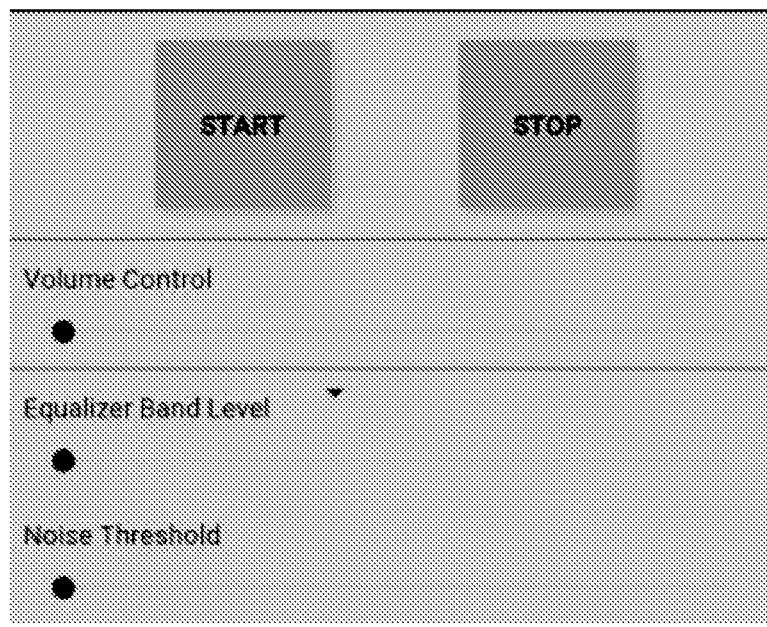
FIG. 2 illustrates home screen for the present mobile phone based hearing loss correction system.

As seen in FIG. 2, when the user starts on the present system, mobile application embodied in the application processor first checks if the permissions have been granted by the user of not. Current development requires that the user give the permission for—record audio. Unlike other applications involving audio, this application does not need any storage permissions (internal or external) as everything is done on the streaming data. So once the permission is granted the application opens up to home screen as seen in FIG. 2.

The application has 4 functionalities:
a. "Start" button for starting the audio stream.
b. "Stop" button for stopping all audio stream.
c. Volume control seek-bar for controlling the volume.
d. 5 band Equalizer control.
e. 5 band Multi-Band Compressor (MBC) stage.

Figure 3:
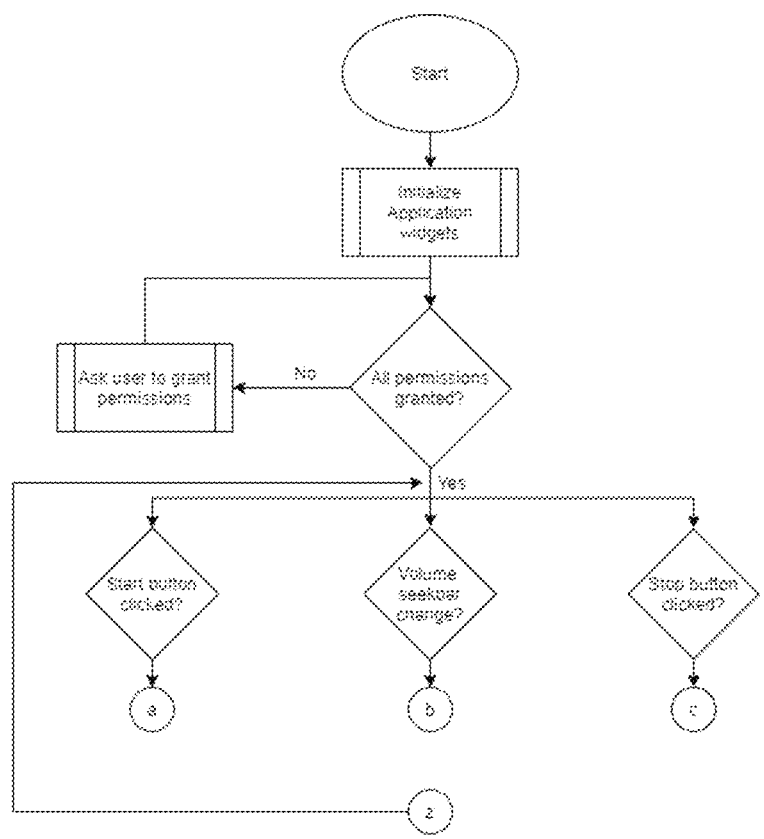
FIG. 3 illustrates operational stages associated with activation of the present mobile phone based hearing loss correction system.

Reference is now invited from the accompanying FIG. 3 which illustrates operational stages associated with activation of the present mobile phone based hearing loss correction system. The stages are as follows—When the application is opened, the application asks for the permission to record audio from microphone hardware (internal/external). No other permissions are required as the application works on live streaming data without storing into any external or internal media storage space. Once permission has been granted, the application initializes dashboard with all controls to start operating. The dashboard embedded in the application processor contains— a. Start switch—This starts the process of getting input from input device like the microphone, applying filters to it and sending the output directly to the output device plugged in to the ear as a live audio stream.
b. Stop switch—This stops the live audio streaming.
c. The volume controlling switch—This is the controller for the volume for the output audio stream data.
d. Equalizer band controlling switch—This is the gain controller for the bands (More details below). The bands are selectable from the drop down menu and the gain of each band controllable. Optimal initial values have been set during the development of the application.
e. Noise Threshold controlling switch—Although the optimal noise filter levels have been set during development there is also the option of increasing the noise threshold level for the streaming data.

The application processor of the present system can be configured by using the DynamicsProcessing API. It is an audio effect for equalizing and changing dynamic range properties of the sound. It is composed of multiple stages including equalization, multi-band compression and limiter In the present system, the application processor is configured to directly stream the environmental sound signal from the mobile phone inbuilt microphone to the headphones or speakers unit upon real time amplification and background noise suppression without involving any storage elements of the mobile phone and operates based on user's instruction from user interface of the mobile phone. In accordance with a preferred aspect an omni-directional microphone id proposed which can capture Direction Independent Sound & Speech. Preferably a 60 dB SPL Microphone can be used as mobile microphone.

The application processor preferably includes sound signal streaming channel having multiple basebands of frequencies covering range of 30 Hz to 20000 Hz for dividing the sound signal into different streaming basebands of frequencies. The audible range of human being is from 20 Hz to 20 KHz. and voice and other sound frequencies like different types of noises reside in different bands of frequencies. The reason for dividing the streaming sound signal into different bands in range of 30 Hz to 20000 Hz is to have the more flexibility of configurable filtering the different audible sound signal streaming bands of frequencies based on noises reside in therein and controlling the streaming sound.

Figure 4:
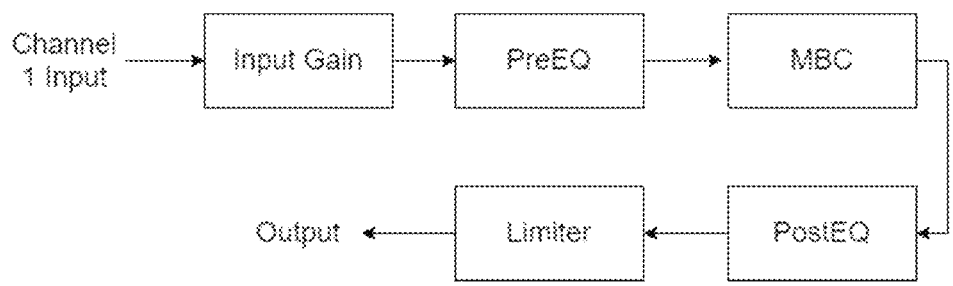
FIG. 4 shows basic channel configuration associated with the present mobile phone based hearing loss correction system.
Figure 5:
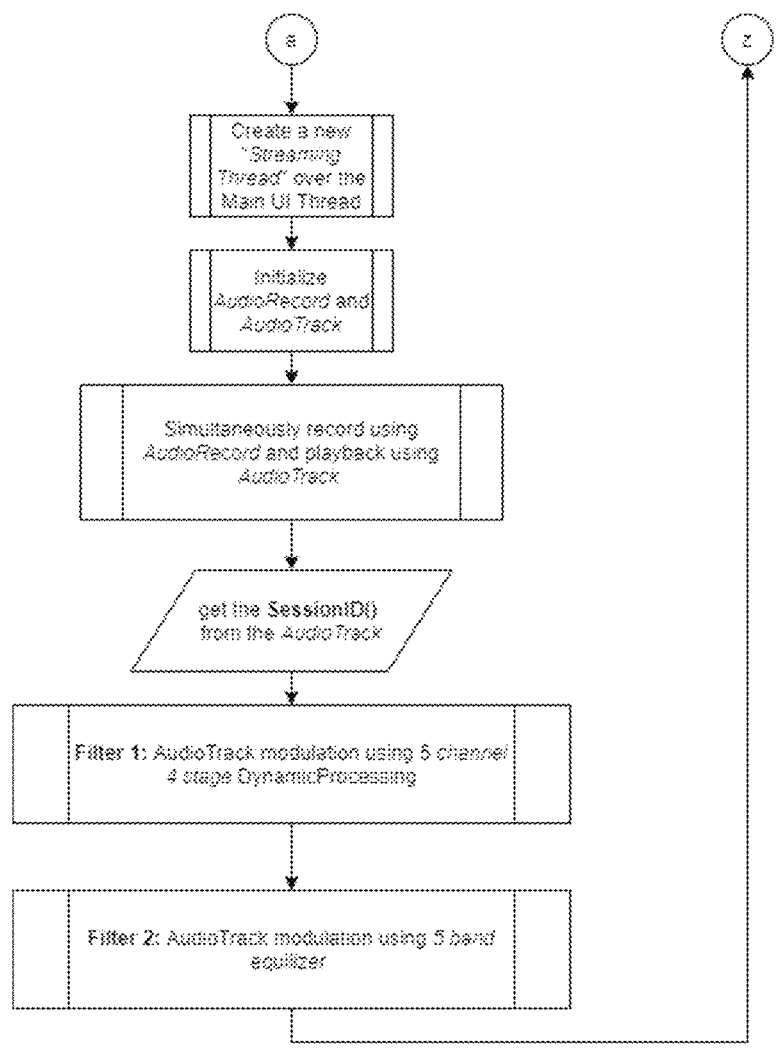
FIG. 5 shows sound processing stages associated with activation of the present mobile phone based hearing loss correction system.
Figure 6:
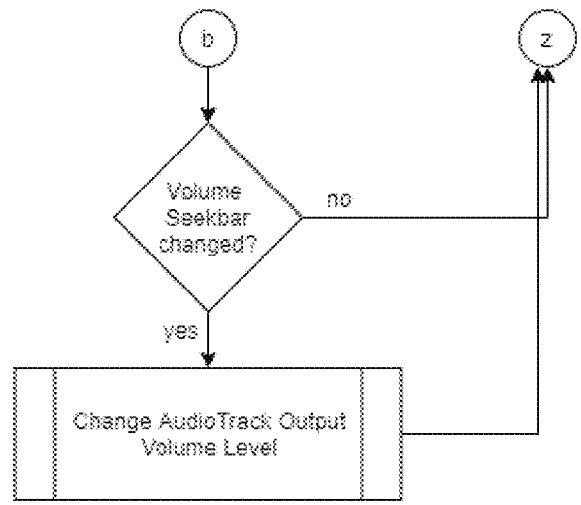
FIG. 6 shows sound level changing stages associated with the present mobile phone based hearing loss correction system.
Figure 7:
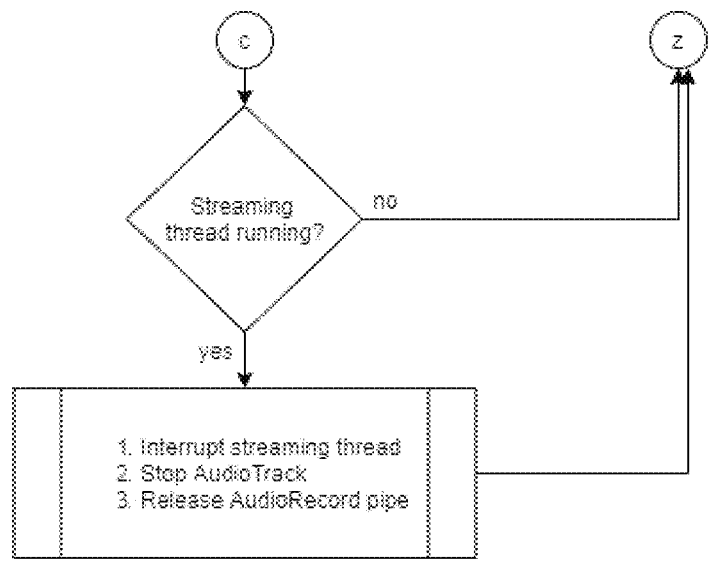
FIG. 7 shows sound signal streaming stages associated with activation of the present mobile phone based hearing loss correction system.

When the start switch is clicked, the audio data captured from the microphone device is passed through the channel of the application processor as shown in FIG. 4. The output of channel of the application processor is further passed through the noise gate and the processed output data sent to the output speaker device.

The number of bands and active stages is configurable, and most parameters can be controlled in real-time. The effect is instantiated and controlled by channels. In present application, the entire baseband has divided the audible range of 30 Hz to 20000 Hz in to 5 distinct bands, the specifics of which are written down in table 1 below.

TABLE 1

| EqBand# | Centre(mHz) | Min(mHz) | Max(mHz) |
|---|---|---|---|
| 1 | 60000 | 30000 | 120000 |
| 2 | 230000 | 120001 | 460000 |
| 3 | 910000 | 460001 | 1800000 |
| 4 | 3600000 | 1800001 | 7000000 |
| 5 | 14000000 | 7000001 | 20000000 |

The basic channel configuration of channel is as shown in FIG. 4. As shown in FIG. 4, the sound signal streaming channel of the application processor includes an input gain unit, a first Multi-band Equalizer or Pre-Equalizer, a Multi-band Compressor, a second Multi-band Equalizer or Post-Equalizer and a Single band compressor/limiter. The input gain unit is provided for initial amplification of the sound signal. The first Multi-band Equalizer or Pre-Equalizer is then made initial adjustment of frequency components within the streaming sound signal by strengthening or weakening energy of specific frequency components of the signal to achieve equalization. The Multi-band Compressor then split the equalized sound signal into different frequency bands and compresses them independently for eliminating the noised frequency ranges and to control the sound signal including increasing clarity of sound signal of specific frequency ranges being sent to the output device.

The second Multi-band Equalizer or Post-Equalizer for final adjustment of frequency components within the streaming signal from the Multi-band Compressor by strengthening or weakening energy of specific frequency components of the signal to achieve equalization. The single band compressor/limiter is provided to reduce static and repeating noises including hissing sounds of the microphone in the streaming sound signal from the second Multi-band Equalizer.

The Multi-band Compressor is specifically adapted to compress only a certain part of a frequency spectrum/band, or apply different flavours of compression to several areas of the spectrum/band.

The Multi-band Compressor also provides a flexibility to control the sound being sent to the output speaker device.

A crud example: let say the horn of a vehicle normally resides in the band #4 and #5 and while a group of people is having a conversation where the frequency band range resides in band #2 and #3. Then if #4 and #5 frequency band can be cleared up while increasing the clarity of the #2 and #3 bands at the same time, the horn will have a lower volume than the voices. This has been achieved for the 5 bands where the numerical values have been pre-set for optimal performance of each band. Then the last noise suppressor filter further reduces static and repeating noises like hissing sounds of a microphone.

The Multi-band Compressor's operation includes the following stages:—
a. Attack Time: sets attack time for compressor in milliseconds (ms). Sets the speed at which the compressor acts on the input signal. A slow attack time allows the beginning component of a signal (commonly referred to as the initial transient) to pass through, uncompressed, whereas a fast attack time triggers compression immediately when a signal exceeds the threshold.
b. Release Time: sets release time for compressor in milliseconds (ms). Sets the length of time the compressor takes to return the gain reduction back to zero (no gain reduction) after crossing below the compression threshold. Very short release times can produce a choppy or "jittery" sound, especially when compressing instruments that have a lot of low-frequency components, such as a bass guitar. Very long release times can result in an over-compressed, or "squashed," sound.
c. Ratio: The ratio sets the compression slope, which is a function of the output level versus the input level. For example, if you have the ratio set to 2:1, any signal levels above the threshold setting will be compressed at a ratio of 2:1. This means that for every 2 dB of level increase above the threshold, the compressor's output will only increase 1 dB. How severely the compressor reduces the signal, is determined by two parameters: ratio and threshold. A ratio of 2:1 or less is considered mild compression, reducing the output by a factor of two for signals that exceed the compression threshold. Ratios above 10:1 are considered hard limiting. Assuming a nominal input-signal level, as the compression threshold is lowered, more of the input signal is compressed.
d. Threshold: threshold value for compressor.
e. Knee Width: This is also a compressor component. It can be a soft or hard knee. With hard-knee compression, the gain reduction applied to the signal occurs as soon as the signal exceeds the level set by the threshold. With soft-knee compression, the onset of gain reduction occurs gradually after the signal has exceeded the threshold, producing a more musical response
f. Noise Gate Threshold: The gate threshold sets the level at which the gate opens. Essentially, all signals above the threshold setting are passed through unaffected, whereas signals below the threshold setting are reduced in level by the amount set by the range control.

g. Expander Ratio: The expansion ratio sets the amount of reduction applied to a signal once the signal has dropped below the expansion threshold. For example, a 2:1 expansion ratio attenuates a signal 2 dB for every 1 dB it drops below the threshold. Expanders and noise gates are used almost identically. The main difference is that an expander is smoother and more gradual, so that it is easier to set the attack and release times correctly.

h. Pre-Gain: sets the gain to be applied to the signal BEFORE the compression, measured in decibels (dB), where 0 dB means no level change.

i. Post-Gain: sets the gain to be applied to the signal AFTER the compression. Measured in decibels (dB), where 0 dB means no level change.

In addition to this above steps the sound frame goes through the NoiseSupressor api. Noise suppression (NS) is an audio pre-processor which removes background noise from the captured signal. The component of the signal considered as noise can be either stationary (car/airplane engine, AC system) or non-stationary (other peoples' conversations, car horn) for more advanced implementations.

The invention claimed is:

1. A mobile phone based hearing loss correction system comprising
a microphone unit;
a speaker unit; and
a mobile phone inbuilt application processor to operatively connect said microphone unit with said speaker unit for recording environmental sound signal though the microphone unit and storage free direct streaming of said recorded sound signal to the speaker unit upon real time amplification and background noise suppression;
wherein the application processor includes sound signal streaming channel having multiple bands of frequencies in range of 30 Hz to 20000 Hz for dividing the sound signal into different streaming bands of frequencies for configurable filtering of said different streaming bands based on noises reside in therein and controlling the streaming sound signal;
wherein the sound signal streaming channel includes:
an input gain unit for initial amplification of the sound signal;
a first Multi-band Equalizer or Pre-Equalizer for initial adjustment of frequency components within the sound signal by strengthening or weakening energy of specific frequency components of the sound signal to achieve equalization;
a Multi-band Compressor to split the equalized sound signal into different frequency bands and compress them independently for eliminating noised frequency bands and to control the sound signal including increasing clarity of the sound signal by sending specific frequency bands thereof to the speaker;
a second Multi-band Equalizer or Post-Equalizer for final adjustment of frequency components within the sound signal from the Multi-band Compressor by strengthening or weakening energy of specific frequency components of the sound signal to achieve equalization; and a Single band compressor/limiter to reduce static and repeating noises including hissing sounds of the microphone in the sound signal from the second Multi-band Equalizer.

2. The mobile phone based hearing loss correction system as claimed in claim 1, wherein the microphone unit comprises the mobile phone inbuilt microphone which is an omni-directional microphone to record environmental sound and generate the sound signal for the application processor.

3. The mobile phone based hearing loss correction system as claimed in claim 1, wherein the speaker unit comprises headphones or speakers remotely connectable to the mobile phone in wired or wireless manner for receiving amplified and background noise suppressed streaming sound signal from the application processor and playing the same.

4. The mobile phone based hearing loss correction system as claimed in claim 1, wherein the application processor is configured to directly stream the sound signal from the mobile phone inbuilt microphone to the headphones or speakers unit upon real time amplification and background noise suppression without involving any storage elements of the mobile phone and operates based on user's instruction from user interface of the mobile phone.

5. The mobile phone based hearing loss correction system as claimed in claim 1, wherein the sound signal streaming channel includes 5 bands with identical architecture and independent parameters covering the frequency range of 30 Hz to 20000 Hz wherein a first band has a minimum frequency of 30000 mHz and a maximum frequency of 120000 mHz with a center frequency of 60000 mHz, a second band has a minimum frequency of 120001 mHz and a maximum frequency of 460000 mHZ with a center frequency of 230000 mHz, a third band has a minimum frequency of 460001 mHz and a maximum frequency of 1800000 mHz with a center frequency of 910000 mHz, a fourth band has a minimum frequency of 1800001 mHz and a maximum frequency of 7000000 mHz with a center frequency of 3600000 mHz, and a fifth band has a minimum frequency of 7000001 mHz and a maximum frequency of 20000000 mHZ with a center frequency of 14000000 mHZ

| Eq Band# | Centre (mHz) | Min(mHz) | Max(mHz) |
| --- | --- | --- | --- |
| 1 | 60000 | 30000 | 120000 |
| 2 | 230000 | 120001 | 460000 |
| 3 | 910000 | 460001 | 1800000 |
| 4 | 3600000 | 1800001 | 7000000 |
| 5 | 14000000 | 7000001 | 20000000. |

6. The mobile phone based hearing loss correction system as claimed in claim 1, wherein the application processor includes
start switch to starts the process of getting sound signal from the microphone, applying filters to it and sending the speaker as a live audio stream;
volume controller switch for controlling volume of the live audio stream;
equalizer band controller switch for controlling gain of each bands;
noise threshold controller switch for increasing noise threshold level for the sound signal; and
stop switch to stop the live audio streaming.

7. The mobile phone based hearing loss correction system as claimed in claim 1, wherein the application processor further comprises noise gate operatively connected to the sound signal streaming channel for further removing noise from the sound signal received from the sound signal streaming channel before sending to the speaker.

8. The mobile phone based hearing loss correction system as claimed in claim 1, wherein the Multi-band Compressor independently compress the frequency bands by including
- setting attack time in milliseconds and speed at which the compressor acts on the input signal whereby slow attack time allows beginning component of the signal to pass through, uncompressed and whereby a fast attack time triggers compression immediately when the signal exceeds a compression threshold;
- setting release time in milliseconds and length of time the compressor takes to return gain reduction of the signal back to zero after crossing below the compression threshold whereby a short release times produce a choppy or "jittery" sound, when compressing instrument sounds having low-frequency components and whereby long release times result in an over-compressed, or "squashed," sound;
- setting compression slope ration, which is a function of signal output level versus signal input to selectively operate between mild compression and hard compression; and
- setting the compression threshold.

9. The mobile phone based hearing loss correction system as claimed in claim 8, wherein the Multi-band Compressor independently compress the frequency ranges by further including
- setting Knee Width of the compressor either in soft knee or in hard knee, whereby with the hard-knee compression, the gain reduction applied to the signal occurs as soon as the signal exceeds the level set by a threshold and with the soft-knee compression, the onset of gain reduction occurs gradually after the signal has exceeded the threshold, producing a more musical response;
- setting noise gate threshold for fixing level at which the noise gate opens whereby essentially, all signals above the threshold setting are passed through unaffected and signals below the threshold setting are reduced in level by the amount set by range control;
- setting expansion ratio for fixing amount of reduction applied to a signal once the signal has dropped below an expansion threshold.

* * * * *